(12) United States Patent
Xu et al.

(10) Patent No.: US 11,245,408 B2
(45) Date of Patent: Feb. 8, 2022

(54) SUCCESSIVE APPROXIMATION REGISTER ANALOG-TO-DIGITAL CONVERTER AND ASSOCIATED CONTROL METHOD

(71) Applicants: FARADAY TECHNOLOGY CORPORATION, Suzhou (CN); Faraday Technology Corp., Hsin-Chu (TW)

(72) Inventors: Feng Xu, Suzhou (CN); Chih-Yuan Hung, Hsin-Chu (TW); Meng Zhao, Suzhou (CN)

(73) Assignees: FARADAY TECHNOLOGY CORPORATION, Suzhou (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/151,673

(22) Filed: Jan. 19, 2021

(65) Prior Publication Data
US 2021/0305990 A1 Sep. 30, 2021

(30) Foreign Application Priority Data
Mar. 25, 2020 (CN) .......................... 202010216209.7

(51) Int. Cl.
*H03M 1/06* (2006.01)
*H03M 1/00* (2006.01)

(52) U.S. Cl.
CPC ................. *H03M 1/0617* (2013.01)

(58) Field of Classification Search
CPC .................................................. H03M 1/0617
USPC ......................... 341/118, 120, 163, 155, 144
See application file for complete search history.

(56) References Cited

U.S. PATENT DOCUMENTS

| 11,025,263 | B2* | 6/2021 | Kumar | H03M 1/124 |
| 2012/0299654 | A1* | 11/2012 | Hou | H03F 3/3001 |
| | | | | 330/260 |
| 2020/0057484 | A1 | 2/2020 | Coln | |

* cited by examiner

Primary Examiner — Peguy Jean Pierre
(74) Attorney, Agent, or Firm — Winston Hsu

(57) ABSTRACT

A Successive Approximation Register Analog-to-Digital Converter (SAR ADC) is disclosed. The SAR ADC includes a switched capacitor array, a buffer, a comparator and a control logic circuit. The switched capacitor array is arranged to sample an input signal according to a switch control signal to generate a sampling signal. The buffer is arranged to generate a common mode voltage. The comparator is arranged to receive the sampling signal and the common mode voltage in order to generate a comparison result. The control logic circuit is arranged to generate an output signal according to the comparison result, and generate the switch control signal to control the switched capacitor array. The control logic circuit further generates an operation control signal to adjust a Miller compensation capacitor inside the buffer. An associated control method is also disclosed.

12 Claims, 5 Drawing Sheets

SUCCESSIVE APPROXIMATION REGISTER ANALOG-TO-DIGITAL CONVERTER AND ASSOCIATED CONTROL METHOD

BACKGROUND OF THE INVENTION

1. Field of the Invention

The present invention is related to a Successive Approximation Register Analog-to-Digital Converter (SAR ADC).

2. Description of the Prior Art

In a Successive Approximation Register Analog-to-Digital Converter (SAR ADC) that adopts a bottom sampling approach, an input signal may generate a sampling signal to a comparator via sampling of switched capacitors. The comparator further compares the sampling signal with a common mode voltage in order to generate a comparison result, for generating an output signal in following operations. During these operations, the SAR ADC may periodically operate in a sampling phase and a conversion phase. When operating in the sampling phase, an output terminal of the comparator may have extremely large capacitor loading due to the operation of the switched capacitors. When operating in the conversion phase, although the capacitor loading is relatively low, a sufficient bandwidth is required to successfully determine each bit of the output signal. Thus, the buffer for generating the common mode voltage may need to be able to drive extremely large capacitor loading and also needs to have sufficient bandwidth, which increases the design difficulties.

For an SAR ADC that adopts a top sampling approach, although the buffer for generating the common mode voltage does not have large capacitor loading when operating in the sampling phase, errors of the common mode voltage and the comparison result may occur. Thus, the SAR ADC that adopts the top sampling approach can only be applied to low-resolution analog-to-digital converters.

SUMMARY OF THE INVENTION

This in mind, an objective of the present invention is to provide a Successive Approximation Register Analog-to-Digital Converter (SAR ADC), which can make the SAR ADC properly operate in both the sampling phase and the conversion phase via a special buffer design, to solve the problems of the related art.

In one embodiment of the present invention, an SAR ADC is disclosed. The SAR ADC comprises a switched capacitor array, a buffer, a comparator and a control logic circuit. The switched capacitor array is arranged to sample an input signal according to a switch control signal to generate a sampling signal. The buffer is arranged to generate a common mode voltage. The comparator is arranged to receive the sampling signal and the common mode voltage in order to generate a comparison result. The control logic circuit is arranged to generate an output signal according to the comparison result, and generates the switch control signal to control the switched capacitor array. The control logic circuit further generates an operation control signal, to indicate that the SAR ADC operates in a sampling phase or a conversion phase, and the buffer adjusts a Miller compensation capacitor inside the buffer according to the operation control signal.

In another embodiment of the present invention, a control method of an SAR ADC is disclosed. The SAR ADC comprises a switched capacitor array, a buffer, a comparator and a control logic circuit. The switched capacitor array is arranged to sample an input signal according to a switch control signal to generate a sampling signal. The buffer is arranged to generate a common mode voltage. The comparator is arranged to receive the sampling signal and the common mode voltage in order to generate a comparison result. The control logic circuit is arranged to generate an output signal according to the comparison result, and generates the switch control signal to control the switched capacitor array. The control method comprises: adjusting a Miller compensation capacitor inside the buffer according to an operation control signal, wherein the operation control signal is arranged to indicate that the SAR ADC operates in a sampling phase or a conversion phase.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
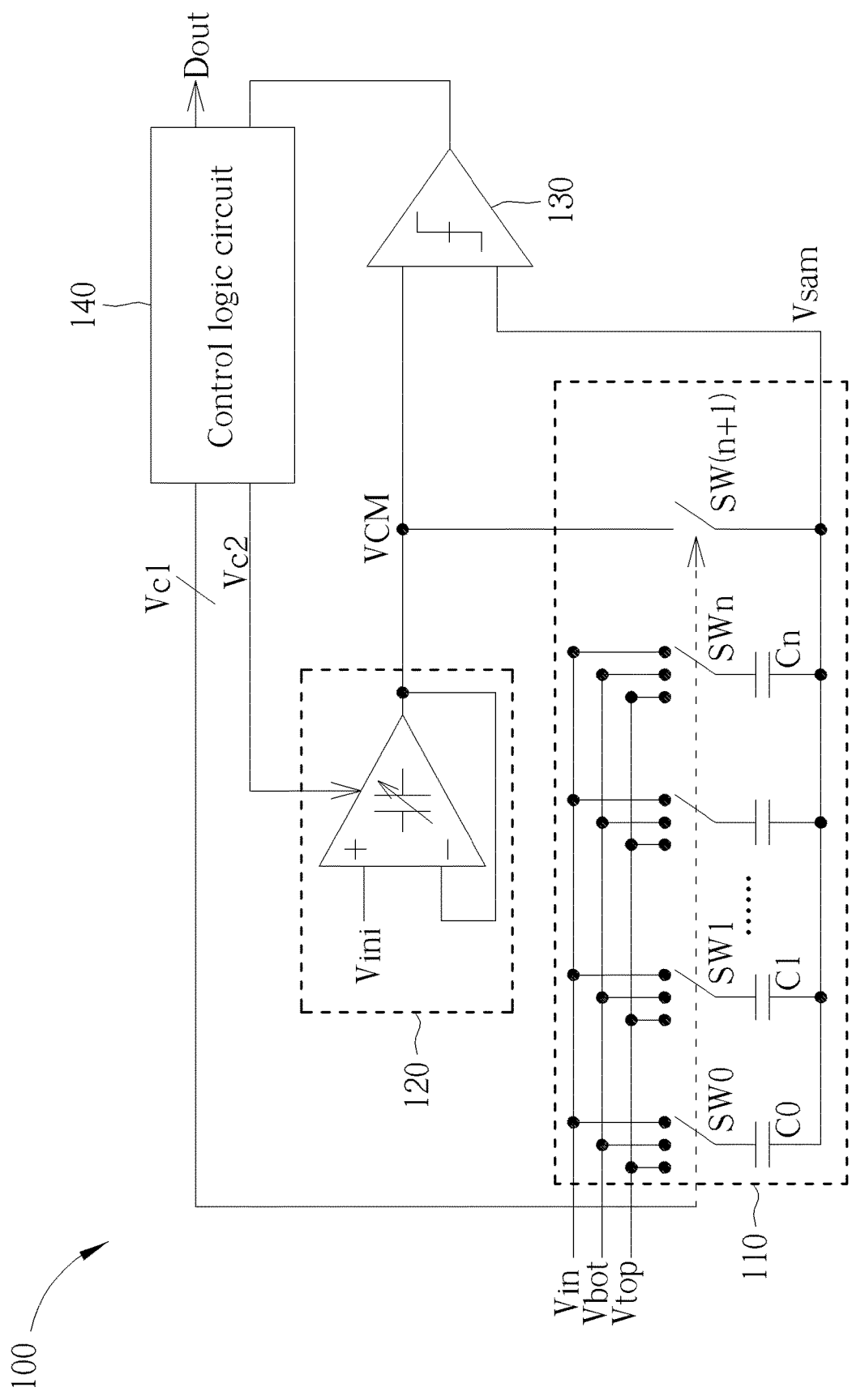
FIG. 1 is a diagram illustrating a Successive Approximation Register Analog-to-Digital Converter (SAR ADC) according to an embodiment of the present invention.

FIG. 1 is a diagram illustrating a Successive Approximation Register Analog-to-Digital Converter (SAR ADC) 100 according to an embodiment of the present invention. As shown in FIG. 1, the SAR ADC 100 comprises a switched capacitor array 110, a buffer 120, a comparator 130 and a control logic circuit 140, where the switched capacitor array 110 comprises multiple capacitors C0 to Cn and multiple switches SW0 to SW(n+1). In this embodiment, the SAR ADC 100 belongs to a bottom sampling SAR ADC, i.e. an input signal Vin is sampled by the switched capacitor array 110 to generate a sampling signal on bottom plate(s) of the capacitors C0 to Cn for being processed by the comparator 130.

In basic operations of the SAR ADC 100, the switched capacitor array 110 is arranged to sample the input signal Vin according to a switch control signal Vc1 to generate a sampling signal Vsam. The buffer 120 is arranged to generate a common mode voltage VCM according to a source signal Vini. The comparator 130 is arranged to receive the sampling signal Vsam and the common mode voltage VCM to generate a comparison result. The control logic circuit 140 is arranged to generate an output signal Dout according to the comparison result, and generate the switch control signal Vc1 to control the switched capacitor array 110. In particular, when the SAR ADC 100 operates in a sampling phase, the control logic circuit 140 may generate the switch control signal Vc1 to control the switches SW0 to SWn to connect the capacitors C0 to Cn to the input signal Vin, for sampling the input signal Vin to generate the sampling signal to the comparator 130, and the comparator 130 compares the sampling signal Vsam with the common mode voltage VCM to generate the comparison result. When the SAR ADC 100 operates in a conversion phase, the control logic circuit 140 may generate the switch control signal Vc1 according to the comparison result, to control the switches SW0 to SWn to respectively connect the capacitors C0 to Cn to a reference voltage Vbot or a reference voltage Vtop, for generating each bit of the output signal Dout.

As the basic operations of the SAR ADC 100 are well known by those skilled in this art, and the present invention is directed to the design of the buffer 120, the following description focuses on the buffer 120; detailed operations associated with the switched capacitor array 110, the comparator 130 and the control logic circuit 140 within the SAR ADC 100 are omitted here for brevity.

Figure 2:
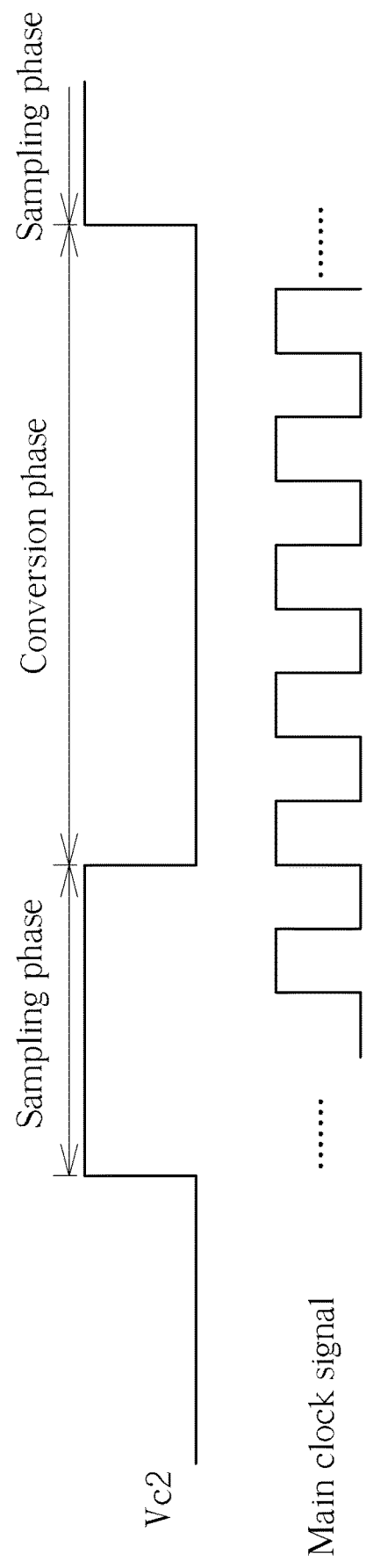
FIG. 2 is a diagram illustrating an operation control signal and a main clock signal.

In this embodiment, as the buffer 120 may have extremely large capacitor loading due to the switched capacitor array 110 when the SAR ADC 100 operates in the sampling phase, and an extremely large bandwidth may be required in the sampling phase, the control logic circuit 140 may further generate an operation control signal Vc2 to indicate that the SAR ADC operates in the sampling phase or the conversion phase, and the buffer 120 adjusts a Miller compensation capacitor according to the operation control signal Vc2 to make the buffer have good performance when operating in both the sampling phase and the conversion phase. In detail, refer to the operation control signal Vc2 and the main clock signal shown in FIG. 2. When the SAR ADC 100 operates in the sampling phase or when the SAR ADC 100 is switched from the conversion phase to the sampling phase, the buffer 120 may increase the Miller compensation capacitor therein, to make the buffer 120 be able to effectively handle the switched capacitor array 110 having extremely large capacitor loading. At this moment, although the operation of increasing the Miller compensation capacitor of the buffer 120 may reduce the bandwidth of the SAR ADC 100, as the time period of the sampling phase can be determined/modified by a designer and will usually comprise multiple cycles of the main clock signal, a low bandwidth occurring in the sampling phase will not affect overall operations of the SAR ADC 100. By comparison, when the SAR ADC 100 operates in the conversion phase or is switched from the sampling phase to the conversion phase, the buffer 120 may reduce the Miller compensation capacitor therein to make the SAR ADC 100 have a sufficient bandwidth, such that one bit of the output signal Dout can be effectively generated within one cycle of the main clock signal, e.g. a first bit is generated within a cycle T1, a second bit is generated within a cycle T2, and so on. At this moment, although the operation of reducing the Miller compensation capacitor may make the buffer 120 unable to drive relatively large capacitor loading which reduces stability, because the capacitor loading caused by the switched capacitor array 110 during the conversion phase is quite small, the effect of reducing the stability of the buffer 120 will not affect the overall operations of the SAR ADC 100.

As mentioned above, since the buffer 120 of this embodiment can have different designs of the Miller compensation capacitor during the sampling phase and the conversion phase, the SAR ADC can have good performance in any phase.

Figure 3:
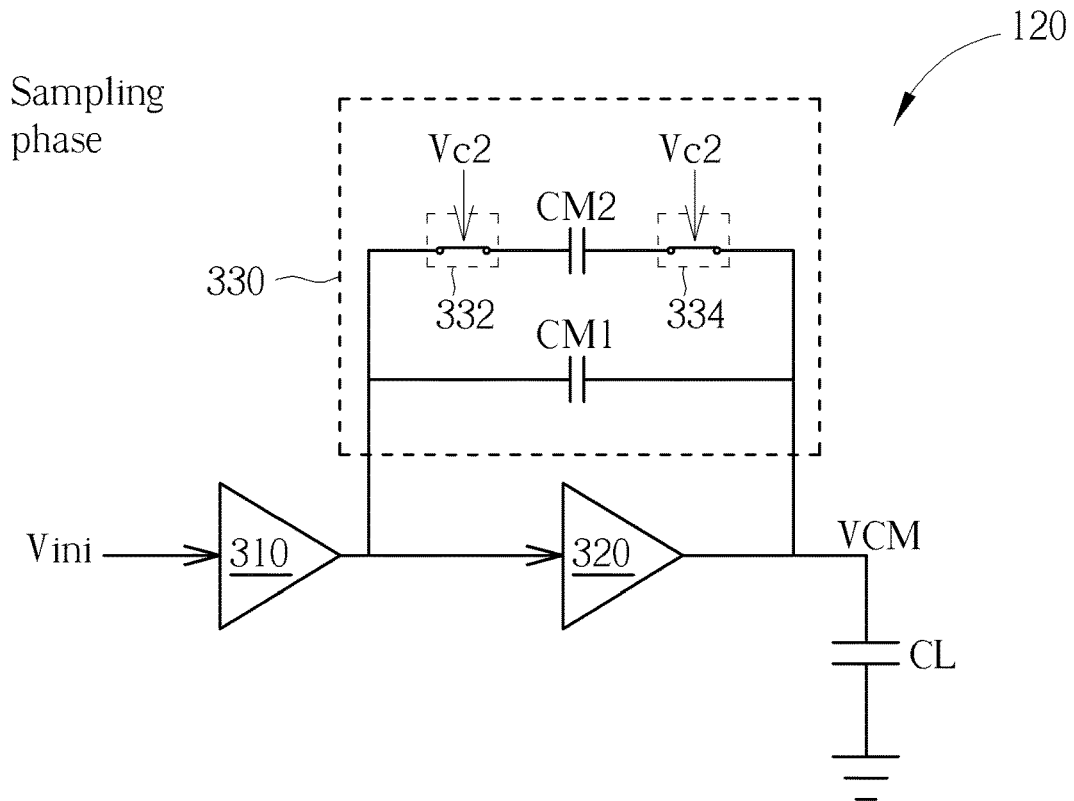
FIG. 3 is a diagram illustrating a buffer when an SAR ADC operates in a sampling phase according to an embodiment of the present invention.

FIG. 3 is a diagram illustrating the buffer 120 when the SAR ADC 100 operates in the sampling phase according to an embodiment of the present invention. As shown in FIG. 3, the buffer 120 comprises amplifiers 310 and 320, and an adjustable capacitor 330 connected between an input terminal and an output terminal of the amplifier 320, where the adjustable capacitor 330 comprises capacitors CM1 and CM2, and switches 332 and 334. In the sampling phase shown in FIG. 3, the amplifiers 310 and 320 process the source signal Vini to generate the common mode voltage VCM, and the switches 332 and 334 are in a turned-on state (e.g. conductive), so that the adjustable capacitor 330 of the Miller compensation capacitor of the buffer 120 can be regarded as having a relatively large capacitance in order to drive a relatively large loading capacitor CL, where the loading capacitor CL at this moment comprises capacitances of the capacitors C1 to Cn and associated parasitic capacitor(s).

Figure 4:
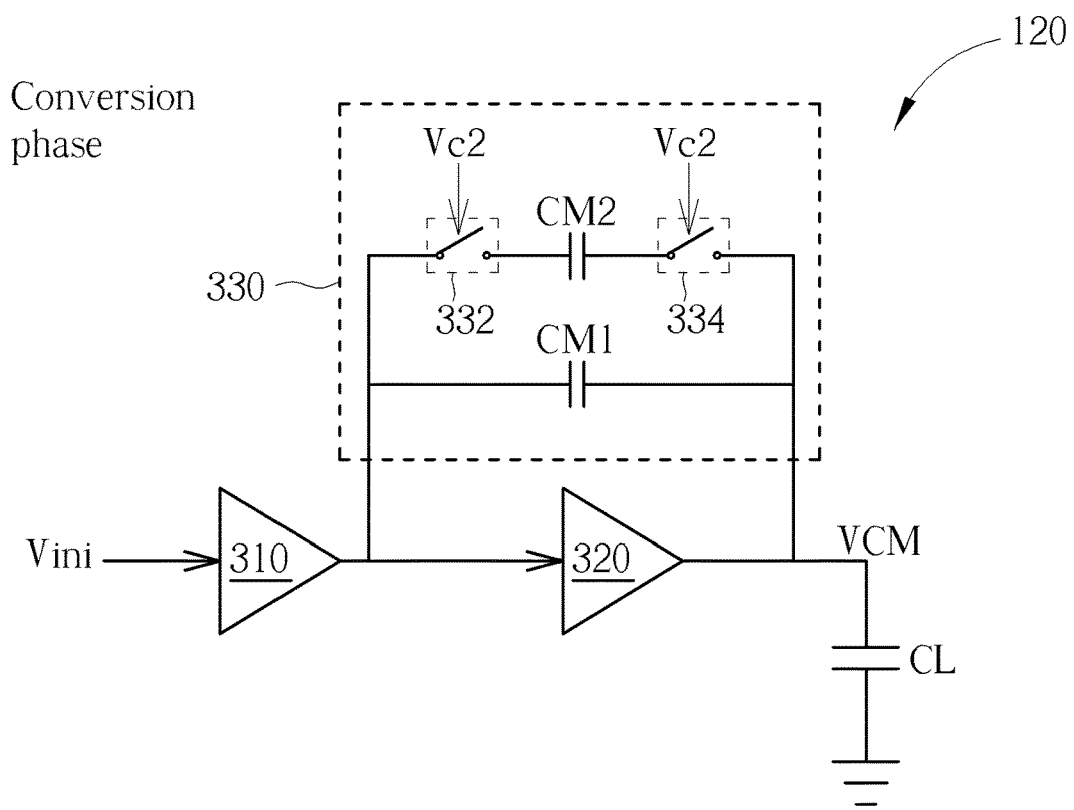
FIG. 4 is a diagram illustrating a buffer when an SAR ADC operates in a conversion phase according to an embodiment of the present invention.

FIG. 4 is a diagram illustrating the buffer 120 when the SAR ADC 100 operates in the conversion phase according to an embodiment of the present invention. In the conversion phase shown in FIG. 4, the switches 332 and 334 are in a turned-off state (e.g. not conductive), so that the adjustable capacitor 330 of the Miller compensation capacitor of the buffer 120 can be regarded as having a relatively small capacitance, where the loading capacitor CL at this moment has a relatively small capacitance.

Figure 5:
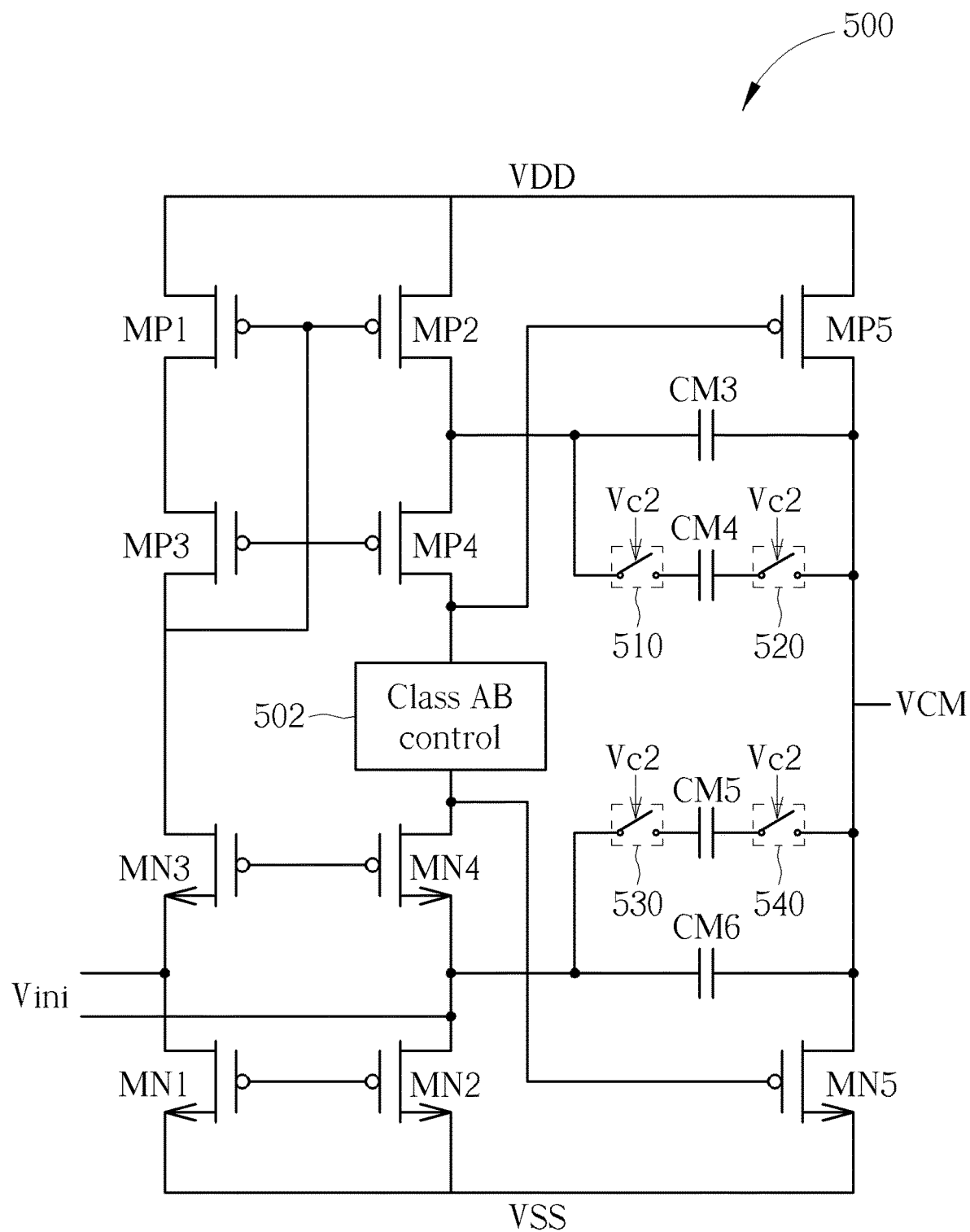
FIG. 5 is a detailed architecture diagram illustrating a buffer according to an embodiment of the present invention.

FIG. 5 is a detailed architecture diagram illustrating a buffer 500 according to an embodiment of the present invention, where the buffer 500 may be arranged to implement the buffer 120 shown in FIG. 1. As shown in FIG. 5, the buffer 500 comprises multiple N-type transistors MN1 to MN5, multiple P-type transistors MPI to MP5, multiple capacitors CM3 to CM6, and multiple switches 510, 520, 530 and 540, which are connected between a supply voltage VDD and a ground voltage VSS. In this embodiment, the source signal Vini may be a differential signal, e.g. a differential signal of the input signal Vin of the SAR ADC 100.

It should be noted that embodiments of FIG. 3 to FIG. 5 are for illustrative purposes only, and are not meant to be a limitation of the present invention. In other embodiments, as long as the Miller compensation capacitor of the buffer 120 can have different capacitances in response to the SAR ADC 100 operating in the sampling phase and the conversion phase, the buffer 120 may be implemented by other types of circuit architecture.

In the above embodiments, in the sampling phase of the SAR ADC 100, the buffer 120 increases overall stability via increasing the Miller compensation capacitor. In another embodiment of the present invention, when the switched capacitor array 110 has a capacitance that is large enough to maintain the stability, the Miller compensation capacitor of the buffer 120 may be omitted, i.e. the dominant pole of the buffer 120 is exactly the dominant pole of an output stage (or the dominant pole which is seen by an output capacitor), and therefore overall stability can be improved. In particular, when the operation control signal Vc2 indicates that the SAR ADC 100 is switched from the sampling phase to the conversion phase, the buffer 120 increases the Miller compensation capacitor therein; and when the operation control signal Vc2 indicates that the SAR ADC 100 is switched from the conversion phase to the sampling phase, the buffer 120 prevents utilizing the Miller compensation capacitor therein.

Figure 6:
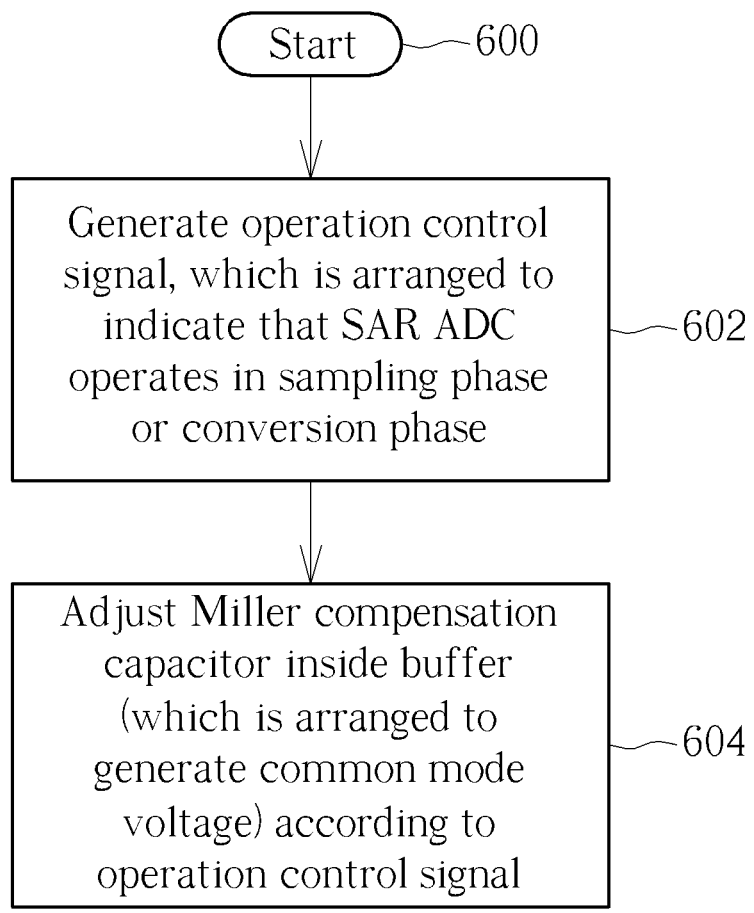
FIG. 6 is a flowchart illustrating a control method of an SAR ADC according to an embodiment of the present invention.

FIG. 6 is a flowchart illustrating a control method of an SAR ADC according to an embodiment of the present invention. Referring to the embodiments mentioned above, the control method is illustrated as follows:

Step 600: the flow starts.

Step 602: generate an operation control signal, which is arranged to indicate that the SAR ADC operates in a sampling phase or a conversion phase.

Step 604: adjust a Miller compensation capacitor inside a buffer (which is arranged to generate a common mode voltage) according to the operation control signal.

Briefly summarized, the SAR ADC and the associated control method of the present invention can have different Miller compensation capacitor designs when the SAR ADC operates in the sampling phase and the conversion phase, resulting in the SAR ADC having good performance in any phase under a condition where a simple design is adopted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Successive Approximation Register Analog-to-Digital Converter (SAR ADC), comprising:
    a switched capacitor array, arranged to sample an input signal according to a switch control signal to generate a sampling signal;
    a buffer, arranged to generate a common mode voltage;
    a comparator, arranged to receive the sampling signal and the common mode voltage in order to generate a comparison result; and
    a control logic circuit, arranged to generate an output signal according to the comparison result, and generate the switch control signal to control the switched capacitor array;
    wherein the control logic circuit further generates an operation control signal, to indicate that the SAR ADC operates in a sampling phase or a conversion phase, and the buffer adjusts a capacitance of a Miller compensation capacitor inside the buffer according to the operation control signal.

2. The SAR ADC of claim 1, wherein the buffer comprises:
    an amplifier, arranged to generate the common mode voltage; and
    an adjustable capacitor, coupled between an input terminal and an output terminal of the amplifier, wherein the adjustable capacitor is taken as the Miller compensation capacitor.

3. The SAR ADC of claim 1, wherein when the SAR ADC operates in the sampling phase, the capacitance of the Miller compensation capacitor inside the buffer is greater than when the SAR ADC operates in the conversion phase.

4. The SAR ADC of claim 3, wherein the buffer comprises:
    an amplifier, arranged to generate the common mode voltage; and
    an adjustable capacitor, coupled between an input terminal and an output terminal of the amplifier, wherein the adjustable capacitor is taken as the Miller compensation capacitor.

5. The SAR ADC of claim 1, wherein when the operation control signal indicates that the SAR ADC is switched from the sampling phase to the conversion phase, the buffer reduces the capacitance of the Miller compensation capacitor therein; and when the operation control signal indicates that the SAR ADC is switched from the conversion phase to the sampling phase, the buffer increases the capacitance of the Miller compensation capacitor therein.

6. The SAR ADC of claim 5, wherein the buffer comprises:
    an amplifier, arranged to generate the common mode voltage; and
    an adjustable capacitor, coupled between an input terminal and an output terminal of the amplifier, wherein the adjustable capacitor is taken as the Miller compensation capacitor.

7. The SAR ADC of claim 1, wherein when the SAR ADC operates in the sampling phase, the buffer prevents utilizing the Miller compensation capacitor.

8. The SAR ADC of claim 1, wherein when the operation control signal indicates that the SAR ADC is switched from the sampling phase to the conversion phase, the buffer increase the capacitance of the Miller compensation capacitor therein; and when the operation control signal indicates that the SAR ADC is switched from the conversion phase to the sampling phase, the buffer prevents utilizing the Miller compensation capacitor therein.

9. A control method of a Successive Approximation Register Analog-to-Digital Converter (SAR ADC), wherein the SAR ADC comprises:
    a switched capacitor array, arranged to sample an input signal according to a switch control signal to generate a sampling signal;
    a buffer, arranged to generate a common mode voltage;
    a comparator, arranged to receive the sampling signal and the common mode voltage in order to generate a comparison result; and
    a control logic circuit, arranged to generate an output signal according to the comparison result, and generate the switch control signal to control the switched capacitor array;
    wherein the control method comprises:
        adjusting a Miller compensation capacitor inside the buffer according to an operation control signal, wherein the operation control signal is arranged to indicate that the SAR ADC operates in a sampling phase or a conversion phase.

10. The control method of claim 9, wherein the step of adjusting the Miller compensation capacitor inside the buffer according to the operation control signal comprises:
    when the SAR ADC operates in the sampling phase, controlling a capacitance of the Miller compensation capacitor inside the buffer to be greater than when the SAR ADC operates in the conversion phase.

11. The control method of claim 9, wherein the step of adjusting the Miller compensation capacitor inside the buffer according to the operation control signal comprises:
    when the operation control signal indicates that the SAR ADC is switched from the sampling phase to the conversion phase, reducing the capacitance of the Miller compensation capacitor inside the buffer; and
    when the operation control signal indicates that the SAR ADC is switched from the conversion phase to the sampling phase, increasing the capacitance of the Miller compensation capacitor inside the buffer.

12. The control method of claim 9, wherein the step of adjusting the Miller compensation capacitor inside the buffer according to the operation control signal comprises:
    when the operation control signal indicates that the SAR ADC is switched from the sampling phase to the conversion phase, increasing the capacitance of the Miller compensation capacitor inside the buffer; and when the operation control signal indicates that the SAR ADC is switched from the conversion phase to the sampling phase, preventing utilizing the Miller compensation capacitor inside the buffer.

\* \* \* \* \*